United States Patent

Kudo et al.

[11] 4,322,263
[45] Mar. 30, 1982

[54] METHOD FOR HORIZONTAL RIBBON CRYSTAL GROWTH

[75] Inventors: Bosshi Kudo, Nagareyama; Kazuyoshi Matsuo, Murayama; Takeshi Maki, Noda; Masamichi Yoshioka, Yoshikawa, all of Japan

[73] Assignee: The Agency of Industrial Science and Technology, Tokyo, Japan

[21] Appl. No.: 100,480

[22] Filed: Dec. 5, 1979

[30] Foreign Application Priority Data

Dec. 9, 1978 [JP] Japan .................................. 53-153004

[51] Int. Cl.³ .................. C30B 15/06; C30B 15/14
[52] U.S. Cl. ................ 156/617 H; 156/DIG. 88; 156/DIG. 97; 422/249
[58] Field of Search ............ 156/608, 617 H, 617 SP, 156/617 P, DIG. 64, DIG. 88, DIG. 97; 75/135, 143; 65/33, 83, 204; 422/246, 249

[56] References Cited

U.S. PATENT DOCUMENTS 3,370,927 2/1968 Faust, Jr. .................... 156/DIG. 97

FOREIGN PATENT DOCUMENTS 2633961 2/1977 Fed. Rep. of Germany . 156/DIG. 97

OTHER PUBLICATIONS

Tolksdorf and Welz, "Crystal Growth of Magnetic Garnets", published in *Crystals,* by Springer–Verlag Pub. Co., N.Y., Jun. 1978, pp. 24-29.

*Primary Examiner*—Gregory N. Clements
*Attorney, Agent, or Firm*—Kane, Dalsimer, Kane, Sullivan and Kurucz

[57] ABSTRACT

In a method for growing ribbon-like crystal of crystalline substance, a seed crystal is contacted on the upper surface of melt of crystalline substance raised up to the level beyond the upper edge of a crucible, thereafter the contact interface between said seed crystal or a successively growing crystal and the melt (the solid-liquid interface) is cooled under freezing point of said crystalline substance, thereby the crystal is made to successively grow on said solid-liquid interface, while said seed crystal or said successively growing crystal is drawn out substantially in horizontal direction, wherein the circulating convection is made to cause in such a manner that high temperature melt flows underside of said solid-liquid interface, thereby the crystal growth in the direction of depth of the melt is prevented.

3 Claims, 6 Drawing Figures

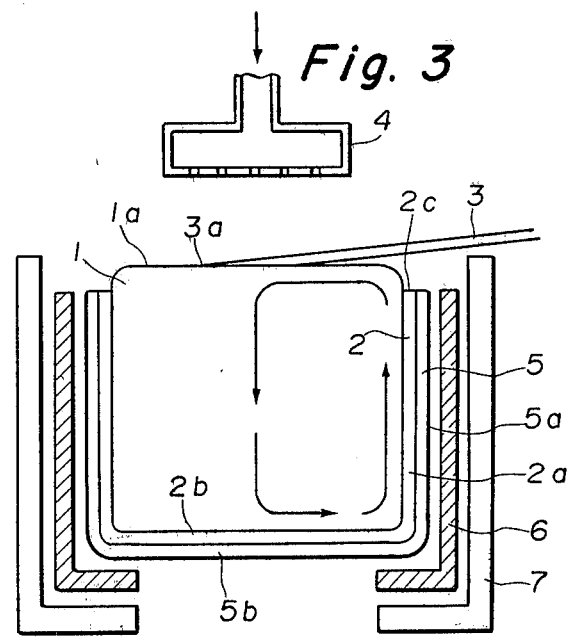
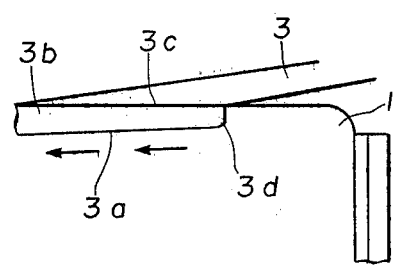
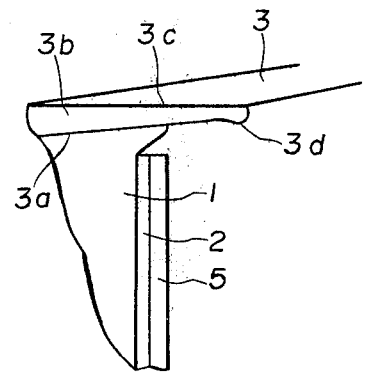

METHOD FOR HORIZONTAL RIBBON CRYSTAL GROWTH

BACKGROUND OF THE INVENTION

This invention relates to an improvement of the method for horizontal ribbon crystal growth (for example, Publication of Japanese Patent Application No. 28388/78), in which thin and flat ribbon crystals of a crystalline substance, such as semi-conductor silicon or the like, is drawn out in a horizontal direction, while crystallizing at the growing tip of a seed crystal, from the horizontal free surface of a melt of said crystalline substance. In particular, this invention provides means for preventing an irregular shape of the grown ribbon crystal, which often occurred in the prior art method and became the cause of an interruption of operation.

In the following the, usual method for horizontal ribbon crystal growth will be explained with reference to FIG. 1.

FIG. 1 is a vertical cross sectional view of a melt containing crucible showing when a ribbon crystal is drawn out. The upper surface 1a of melt 1 of high purity silicon is raised up beyond the level of upper edge 2c of a high purity quartz crucible 2. The melt 1 is heated by a heater 6 arranged so as to surround the circumference of a peripheral wall 5a and the whole area of bottom portion 5b of a heat refractory crucible 5 which holds said crucible 2. Plate 7 is a shielding against heat. After contacting the seed crystal 3 with the upper surface 1a of said melt 1 cooling gas from a cooler 4 is blown upon the contact interface (solid-liquid interface) 3a between the seed crystal 3 and the melt 1, thereby the solid-liquid interface 3a is undercooled to cause crystal (sprout crystal) growth on this interface 3a. After the sprout crystal begins to grow, the seed crystal 3 is drawn out in a horizontal direction with a velocity equal to the velocity of crystal growth and, thereby ribbon crystal is grown.

In the above described method, since the bottom portion 5b of the crucible 5 is uniformly heated over the whole area thereof to the same degree as the peripheral wall 5a, the state of the melt is such that on the lower side of the solid-liquid interface 3a, there exists a heat conducting layer having a downward temperature gradient. Consequently, since the undercooling spreads from the solid-liquid interface 3a in the downward direction in a short time, there often occurs a downgrowth 3d (usually, 5–10 mm) at the junction 3c between the seed crystal 3 and grown crystal 3b at the beginning of sprout crystal growth, as shown in FIG. 2(a), and when the junction 3c is drawn out of the crucible 2, as shown in FIG. 2(b), due to the existence of a recess 3e adjacent to said large down-growth 3d, it occurs that attracted melt 1 escapes out of the crucible 2 accompained with said drawing and is impossible to return into the crucible 2 and, spills down and due to the siphon effect of this spilling a large amount of melt 1 will be lost so that the upper surface 1a of the melt 1 will go down to a lower level than the upper edge 2c of the crucible 2. Further, at the time of said spilling of the melt 1, the upper surface 1a will be disturbed so that the grown crystal 3b separates from the upper surface 1a causing polycrystal growth having irregular shape.

SUMMARY OF THE INVENTION

The object of this invention is to provide a method for horizontal ribbon crystal growth, wherein at the time of sprout crystal growth, circulating convection of melt is achieved so as to flow high temperature melt through the underside of the solid-liquid interface. The cooling of melt in the downward direction under the solid liquid interface can be prevented, and the downward-growth of crystal avoided.

BRIEF DESCRIPTION OF THE DRAWINGS

FIG. 3 is a vertical cross-sectional view of a crucible filled with melt and showing an embodiment of the method according to this invention.

FIG. 4(a) is an enlarged cross-sectional view showing a junction between seed crystal as it occurs and ribbon crystal in the method according to this invention.

FIG. 4(b) is an enlarged cross-sectional view as seen in FIG. 4a but showing a state just before the ribbon crystal separates from the melt.

DETAILED DESCRIPTION OF THE INVENTION

Figure 1:
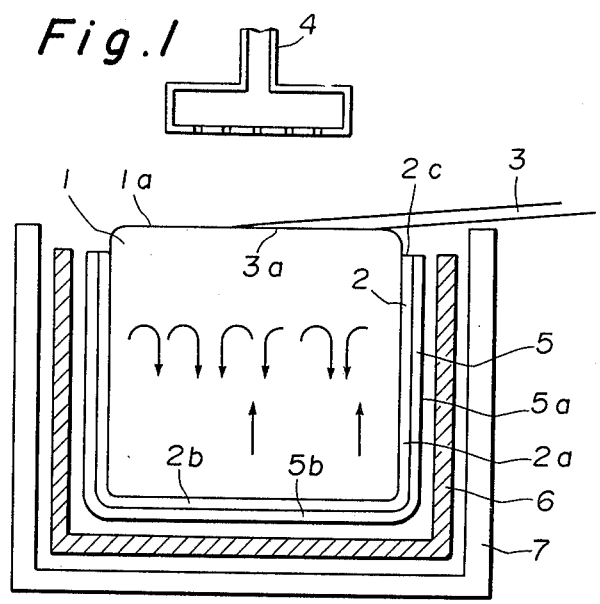
FIG. 1 is a vertical cross-sectional view of a melt containing crucible used in the prior art method.
Figure 2A:
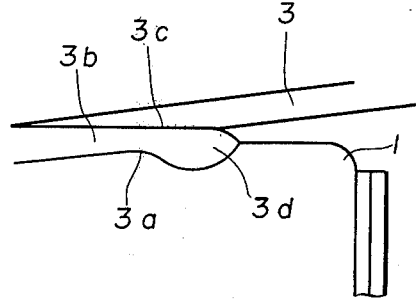
FIG. 2(a) is an enlarged cross-sectional view showing a junction between the seed crystal and ribbon crystal in the prior art method.
Figure 2B:
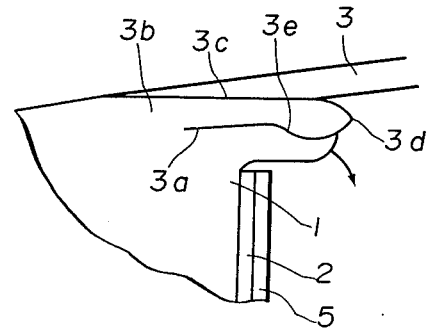
FIG. 2(b) is an enlarged cross-sectional view as in FIG. 2a but showing a state just before the ribbon crystal separates from the melt.

In the following, this invention will be explained in detail by means of describing an embodiment growing ribbon single crystal of semi-conductor silicon. FIG. 3 is a vertical cross-sectional view showing a crucible during the time when a ribbon single crystal is drawn out by the method according to this invention. In FIG. 3, the numeral 1 refers to high purity silicon melt contained in a high purity quartz crucible 2. The upper surface 1a of the melt is raised beyond an upper edge 2c of the crucible 2 a height less than 10 mm, usually up to 3–5 mm high. A seed crystal 3 is cut out from a ribbon shaped silicon single crystal having a thin thickness (usually, 0.5–2 mm) and fixed width (usually, 0.7–15 mm), and is purified by etching. Seed crystal 3 is supported almost horizontally by a crystal holder mechanism (not shown) and is contacted with the surface 1a of the melt 1. Then, to undercool this contacting solid-liquid interface 3a, cooling gas (usually He gas) is blown against said interface 3a from a confronting cooler 4, so that crystal growth (sprout crystal) is formed on said solid-liquid interface 3a. In this way, after the sprout crystal begins to grow, the seed crystal 3 is moved in a predetermined direction by means of said crystal holder mechanism so that the seed crystal 3 separates from the crucible 2 with a velocity equal to its growing velocity. Thereby the ribbon crystal is drawn out.

The preferred method according to this invention comprises that the crucible 2 is dimensioned so its diameter and its depth are almost equal (for example, 120 mm of diameter and 100 mm of depth). A heater 6 is arranged outside of a heat refractory crucible 5 (usually made of high purity graphite) which holds the crucible 2, said heater 6 being normally a resistance heating unit made of high purity graphite, to which controlled electric power is supplied from a power source (not shown). More specifically, as shown in FIG. 3, said heater 6 is provided along the whole length of a vertical peripheral wall 5a of the crucible 5, and also along only the peripheral portion of the bottom 5a of the crucible 5, so as to obtain a heating effect wherein the melt will not solidify. (For example, no heating unit is arranged within 80 mm of the central portion). A heat shielding plate 7 is provided outside of the heater 6, a portion corresponding to the vertical peripheral wall 5a and the bottom peripheral portion. However the central portion of the bottom 5b is made to decrease the effect of shielding. According to such means, the circulating convection of the melt 1, is obtained as shown by the arrow lines in FIG. 3. More particularly, due to the existence of unequal heating the melt portion along the vertical peripheral wall 2a is heated by the vertical portion of the heater 6, reducing its density and causing its upward flow which reaches the upper surface of the melt, and flows underside of the solid-liquid interface 3a to the central portion of the crucible 2 while being cooled. Further, the melt, whose density is increased by the cooling with cooling gas and because of little heating from the central bottom portion 2b of the crucible 2, descends from the top towards the bottom portion 2b, and returns to the lower portion of the peripheral portion 2a where the upward reoccurs after the melt reaches the bottom portion 2b.

In this way, as the result of using the method according to this invention, high temperature melt always flows on the underside of the solid-liquid interface 3a formed by said seed crystal or grown ribbon crystal and the melt, so that, as shown in FIG. 4(a), at the junction 3c between the seed crystal 3 and the grown ribbon crystal 3b as well as at the grown ribbon crystal 3b itself, a minimal down-grown 3d generates (less than about 1–2 mm). Consequently, as shown in FIG. 4(b), when said junction 3c is drawn outside of the crucible 2 and the contact between the melt 1 and the grown crystal 3b is about to be broken, it was found that the slippage at the solid-liquid interface 3a was normally caused and the operation of drawing out could be stably continued.

Further, when the method according to this invention is followed it is preferred that the flow direction of the melt 1 underside of the solid-liquid interface 3a be made to coincide with the opposite direction to the direction of drawing out of the grown ribbon crystal, i.e. the direction of crystal growth. In this way, when the melt passes underside of the growing tip on the side of the direction of crystal growth, it enters a state of most lowest temperature, accordingly, cooling effect at the growing tip of this crystal becomes maximum in the solid-liquid interface 3a, thereby the growing velocity of the crystal can be made larger. On the contrary, if the circulating convection is made to flow in a same direction as the direction of drawing out of the melt, the growing velocity of crystal is limited and becomes disadvantageous and if the circulating convection is made to flow in a direction having some angle to the direction of drawing, it is easily expected that the fluctuation of growth thickness along that direction (ribbon width direction), and also it was empirically confirmed.

What is claimed is:

1. In a method for growing ribbon-like crystal from a melt of crystalline material, which comprises;
    providing a crucible having an open top end defined by a peripheral edge, a closed bottom end and a peripheral wall joining the top end and the bottom end, said crucible being adapted to maintain a crystalline material charge in a melt form;
    charging the crucible with a melt of the crystalline material, to a level above the peripheral edge;
    contacting the upper surface of the melt with a seed crystal, whereby there is formed a solid-liquid interface between the melt and the seed crystal;
    cooling the solid-liquid interface beneath the melting point of the crystalline material, whereby crystal grows at the interface;
    drawing the growing crystal from the interface continuously, in a substantially horizontal direction;
    the improvement which comprises;
        circulating the melt in the crucible by convection so that the melt ascends along the peripheral wall, flows toward the center of the crucible at the top of the melt, descends to the bottom of the crucible beneath the solid-liquid interface and flows toward the peripheral wall along the bottom of the crucible.

2. The method of claim 1 wherein the direction of the flow at the top of the melt is opposite to the direction of the drawing of the growing crystal above the melt.

3. The method of claim 1 wherein the crucible has a depth about equal to its diameter and means for heating arranged along the outside of the peripheral wall.

* * * * *